United States Patent
Hall et al.

(10) Patent No.: US 10,066,069 B2
(45) Date of Patent: Sep. 4, 2018

(54) DECORATIVE COATINGS FOR PLASTIC SUBSTRATES

(71) Applicants: University of South Australia, Adelaide, South Australia (AU); SMR Patents S.à.r.l., Luxembourg (LU)

(72) Inventors: Colin James Hall, Wayville (AU); Drew Raymond Evans, Mawson Lakes (AU); Simon David Field, Flagstaff Hill (AU); Dean Caruso, Hallett Cove (AU)

(73) Assignees: SMR PATENTS S.A.R.L., Luxembourg (LU); THE UNIVERSITY OF SOUTH AUSTRALIA, Adelaide, S. Australia (AU)

( * ) Notice: Subject to any disclaimer, the term of this patent is extended or adjusted under 35 U.S.C. 154(b) by 30 days.

(21) Appl. No.: 15/124,310

(22) PCT Filed: Feb. 20, 2015

(86) PCT No.: PCT/AU2015/000093
§ 371 (c)(1),
(2) Date: Sep. 7, 2016

(87) PCT Pub. No.: WO2015/131223
PCT Pub. Date: Sep. 11, 2015

(65) Prior Publication Data
US 2017/0015802 A1    Jan. 19, 2017

(30) Foreign Application Priority Data
Mar. 7, 2014    (AU) .................................. 2014900781

(51) Int. Cl.
*C08J 7/04* (2006.01)
*C23C 14/20* (2006.01)
(Continued)

(52) U.S. Cl.
CPC ................ *C08J 7/045* (2013.01); *B05D 1/02* (2013.01); *B05D 1/18* (2013.01); *B05D 1/30* (2013.01);
(Continued)

(58) Field of Classification Search
None
See application file for complete search history.

(56) References Cited

U.S. PATENT DOCUMENTS

| | | |
|---|---|---|
| 5,763,024 A | 6/1998 | Yetka |
| 8,282,729 B2 | 10/2012 | Fuller et al. |

(Continued)

OTHER PUBLICATIONS

PCT International Search Report and the Written Opinion, Application No. PCT/AU2015/000093 filed Feb. 20, 2015, dated May 25, 2015.

*Primary Examiner* — Laura C Powers
(74) *Attorney, Agent, or Firm* — MacMillan, Sobanski & Todd, LLC

(57) ABSTRACT

The present invention relates to decorative coatings for plastic substrates, the decorative coatings ideally being stable and durable coatings that are spectrally tunable to permit the selection of a variety of appearances, and ideally providing a decorative metal finish. More particularly the present invention provides for a plastic substrate having a decorative coating including a spectrally controlling system and a stress controlling system. The spectrally controlling system includes alternating absorbing layers and transparent layers, and the stress controlling system controls the overall residual stress of the decorative coating to within a desired range. Further provided are methods for applying to a plastic substrate a decorative coating having a spectrally controlling system and a stress controlling system.

20 Claims, 3 Drawing Sheets

(51) Int. Cl.
  *C23C 14/00*  (2006.01)
  *C23C 14/10*  (2006.01)
  *B05D 1/30*  (2006.01)
  *B05D 1/02*  (2006.01)
  *B05D 1/18*  (2006.01)
  *C09D 5/00*  (2006.01)
  *C09D 1/00*  (2006.01)
  *B05D 5/06*  (2006.01)
  *B05D 7/02*  (2006.01)

(52) U.S. Cl.
  CPC .................. *C09D 1/00* (2013.01); *C09D 5/00* (2013.01); *C23C 14/0015* (2013.01); *C23C 14/10* (2013.01); *C23C 14/205* (2013.01); *B05D 5/06* (2013.01); *B05D 7/02* (2013.01); *C08J 2369/00* (2013.01); *C08J 2483/04* (2013.01)

(56) References Cited

U.S. PATENT DOCUMENTS

2002/0146595 A1   10/2002  Chen
2007/0202344 A1    8/2007  Schettler et al.
2012/0304692 A1*  12/2012  Derrig ..................... A44C 9/00
                                                      63/12

* cited by examiner

DECORATIVE COATINGS FOR PLASTIC SUBSTRATES

CROSS-REFERENCE TO RELATED APPLICATIONS

This application is the National Phase of International Application PCT/AU2015/000093 filed Feb. 20, 2015 which designated the U.S. and that International Application was published in English on Sep. 11, 2015 as International Publication Number WO 2015/131223 A1. PCT/AU2015/000093 claims priority to Australian Provisional Application No. 2014900781, filed Mar. 7, 2014. Thus, the subject nonprovisional application claims priority to Australian Provisional Application No. 2014900781, filed Mar. 7, 2014. The disclosures of both applications are incorporated herein by reference.

BACKGROUND OF THE INVENTION

The present invention relates to decorative coatings for plastic substrates, the decorative coatings ideally being stable and durable coatings that are spectrally tunable to permit the selection of a variety of appearances, including chrome tints, from a gun-metal grey to a piano black, or a brushed-metal look, ideally to provide a decorative metal finish. While the primary use for the coatings of the present invention will generally be as decorative metal finishes in the areas of automotive trim (interior and exterior), consumer goods (such as whitegoods) and various electrical products (such as switch housings), it will be appreciated that the invention is not to be limited to only those uses.

Decorative coatings, especially decorative metal finishes, are becoming increasingly desirable as designer surfaces on a variety of consumer goods including premium automotive interior and exterior trim components, consumer and household goods, as well as fashionable household electronic products, and either as partial or full surfaces for those goods. Furthermore, chrome finishes with custom colours and tints (often with a "brushed-metal" look) are becoming increasing desirable. Such coatings include tinted and deep dark chromes, as well as satin finishes.

While bulk metal can be used for such applications, it is not only heavy and cumbersome to work with, but also difficult and expensive to machine and polish into the complex shapes that are common across these types of components. In addition, bulk metal does not support 'surprise and delight' hidden lighting, or back lighting in general, nor does it lend itself to the formation of a surface where a part of the surface has a different appearance to another part of the surface. Thus, it tends to be more desirable to utilise plastic substrates in such cases.

While metal-look paints, film laminates and metallic inks offer options to create chrome-look surfaces on plastic substrates, they lack the authentic metal appearance that is required with these types of finishes and often show poor durability.

Electroplating of plastics is a common process in depositing metals such as copper, nickel and chrome onto plastic surfaces to create high quality finishes. While these coatings offer high durability, they tend to be susceptible to issues with corrosion (Na, Mg or Ca salts) and electroplating itself utilises hazardous substances (such as Cr6+) that are not environmentally sustainable. Furthermore, they lack the flexibility to cover all areas of the colour spectrum to offer wide customisation of colour tunability and depth of black on chrome. For example, electroplaters offer tinted chromes that not only offer limited durability and colour fastness but are limited to specific areas of the colour spectrum, typically in the positive a* and b* colour space (in the CIELAB system) which is yellow in appearance.

Also, electroplating is completely opaque and does not support 'surprise and delight' hidden lighting, or back lighting in general. In addition to metal finishes, back lighting is becoming a unique branding method for designers to create new functionality with surfaces, increasing the value of their product and further differentiating them from their competitors. Examples of branded back lighting include hidden icons or displays behind tinted plastic or film, and backlighting of fabrics and graphics to create a "surprise and delight' for the consumer.

Physical vapour deposition (PVD) of metals onto plastic surfaces is also a common method of applying metal coatings to plastic surfaces to create a metallic-look finish and can be created thin enough to allow light transmission. However, such coatings are not physically and environmentally durable enough to survive even the most basic consumer testing requirements.

Indeed, none of the above metallic coatings possess tunable properties to offer durable, decorative finishes that allow light transmission. No such coatings offer the ability to converge the need for spectral and optical tunability with metallic finishes to create functional, highly durable, customisable chrome surfaces (for example) from bright through to deep black colours with backlighting functionality if desired.

There is thus a need for a durable, spectrally tunable surface for plastic substrates that allows for the selection of broad ranges of appearance, such as high intensity blacks, and that can be substantially transparent so as to permit hidden lighting functionality if desired.

The above discussion of background is included to explain the context of the present invention. It is not to be taken as an admission that any of the material referred to was published, known, or part of the common general knowledge at the priority date of any one of the claims.

SUMMARY OF THE INVENTION

The present invention provides a plastic substrate coated with a decorative coating, the decorative coating including a spectrally controlling system and a stress controlling system, the spectrally controlling system being multiple layers and optionally including a protective layer, and the stress controlling system being at least a single layer between the spectrally controlling system and the substrate, wherein the multiple layers of the spectrally controlling system are absorbing layers alternating with transparent layers, the optical thickness of the spectrally controlling system being selected such that the decorative coating achieves a desired optical effect, and wherein at least one layer of the stress controlling system has a compressive stress of an amount such that the overall residual stress of the decorative coating is compressive when measured in the absence of the optional protective layer.

To understand the present invention, it is important to understand what is herein meant by the phrase "desired optical effect" and the impact that the determination of the desired optical effect subsequently has upon how the decorative coating is spectrally tuned to provide the coated substrate with that desired optical effect.

The desired optical effect will be a desired appearance for a surface, or a part of a surface, of a product (when viewed from the front) that includes a coated substrate in accordance with the present invention. The desired optical effect will be made up of a combination of a desired transmitted colour, a desired specular reflected colour, and a desired diffuse reflected colour, taking account of the combined influence of the decorative coating, the plastic substrate and the presence or not of backlighting. In this respect, the plastic substrate needs to be taken into account as the substrate may itself be tinted or clear, or may include embedded particles to provide the uncoated substrate with a hazy appearance, or may have one or both of its (uncoated) surfaces bearing a texture such as might be adopted to provide a "brushed-metal" appearance. While all of these attributes will contribute to the overall appearance of the final product, it should be appreciated that it is the decorative coating, and specifically the spectrally controlling system, that is tunable in the present invention to permit the achievement of the desired optical effect.

In relation to a determination of a desired transmitted colour, a desired specular reflected colour, and a desired diffuse reflected colour, reference throughout this specification to a "colour" is reference to a colour that is defined by measured L*, a* and b* values in accordance with the 1976 CIE L*a*b* Space (or CIELAB) colour model, which is an approximately uniform colour scale organised in cube form. In the orthogonal a* and b* colour axes, positive a* values are red, negative a* values are green, positive b* values are yellow and negative b* values are blue, while the vertical scale for lightness (or greyscale) L* runs from 0 (black) to 100 (white), allowing the positioning of a total colour E in three points. The Chroma (C*) of the colour is defined as $\sqrt{(a^{*2}+b^{*2})}$, and is used to quantify the magnitude of the colour independent of its lightness.

It will also be appreciated that reference to "transmitted" colour and "reflected" colour are references to the colour of light after having been transmitted through an object ("transmitted colour") or after having been reflected by the surface of an object ("reflected colour"). Furthermore, with respect to reflected colour, "specular reflection" is a reference to the mirror-like reflection of light from the surface of an object, in which light from a single incoming direction is reflected into a single outgoing direction, whereas "diffuse reflection" is of course a reference to incoming light being reflected in a broad range of directions.

The spectrally controlling system is thus ideally used to modify spectral reflection and transmission, so that the desired optical effect is achieved for the coated substrate. In particular, the optical thickness of the spectrally controlling system is selected such that the decorative coating achieves the desired optical effect. In one form, the magnitude of the spectral transmission is primarily controlled by the total optical thickness of the absorbing layers within the spectrally controlling system. However, both reflected and transmitted colour is controlled by an interference effect between the absorbing and transparent layers within the spectrally controlling system. By controlling the optical thickness of all layers of the spectrally controlling system, including both the absorbing and transparent layers as necessary, this interference effect can be "tuned" so that the desired reflected and transmitted colour can be achieved.

In a preferred form, the optical thicknesses are selected firstly to achieve the desired transmission, which is controlled by the combined optical thicknesses of the absorbing layers. Having established this target, the optical thickness of the transparent layers, and the ratio of the thickness of the individual absorbing layers, are further refined through the use of thin film modelling software (such as Tfcalc™) to achieve a desired reflective colour through an interference effect.

For example, a required product may need a gloss black appearance positioned in front of an illuminated display. This could be achieved via a decorative coating with low, neutral reflective colour with negligible diffuse reflected colour. This would present as a desired transmitted colour of L*=44, a*=0, b*=0 and a desired specular reflected colour of L*=25, a*=0, b*=0.

Taking this example further, using a CrZr alloy as an absorbing layer, a combined thickness of absorbing layers to achieve a % T of ~14% might be ~16.4 nm. To achieve the desired interference, a four layer stack could be used such that the combined thickness of the absorbing layers was split into two layers, 9.7 nm and 6.7 nm, the thicker layer deposited first. An $SiO_2$ transparent layer can then be used to split the two absorbing layers, and a final $SiO_2$ layer deposited on top of that. In this example, a spectrally controlling system comprising of CrZr/$SiO_2$/CrZr/$SiO_2$ is utilised, where the thickness of the $SiO_2$ layers in combination with the CrZr layers is then optimised through a thin film modelling program to achieve the desired reflected colour.

In this respect, it will be appreciated that "optical thickness" is a dimensionless measure of how much a given material retards the passage of light therethrough, derived from the multiplication of the complex refractive index and the distance traveled through the material by a light beam. It is also known as the optical path length. The complex refractive index is a number made up of a real part (defined as refractive index) and an imaginary part (defined as the extinction coefficient). It then will be appreciated that for any given layer of a material, the optical thickness (t) is defined as the material's refractive index (n) multiplied by the layer's physical thickness (d), normalised at the handled wavelength, for a refractive index at this wavelength. By way of example, optical thickness can thus be calculated using a refractive index at a wavelength of 550 nm. For example, chrome:$n_{550}$=3.17, having a physical thickness of 50 nm corresponds to an optical thickness of 0.288, while $SiO_2$:$n_{550}$=1.455, having a physical thickness of 100 nm corresponds to an optical thickness of 0.265.

It should also be appreciated that reference throughout this specification to an "absorbing layer" is a reference to a layer comprising a material, or a blend of materials, having a measured optical extinction coefficient greater than 1 in the spectral range of 400 to 1000 nm. Furthermore, it will be understood that reference to a "transparent layer" throughout this specification is a reference to a layer comprising a material, or a blend of materials, having a measured optical extinction coefficient of less than 1 in the spectral range of 400 to 1000 nm.

If utilised in the decorative coating of the present invention, a protective layer would be applied on top of the spectrally controlling system (and thus be an outermost layer) to provide enhanced abrasion resistance, fingerprint resistance and 'easy clean' functionality. Suitable materials for such a protective layer could be plasma polymerised hexamethyldisiloxane (HMDSO), fluoro polymer based coatings deposited via evaporation or liquid transfer techniques, or a liquid hardcoat applied via spin, dip, spray or flow coating techniques, with or without particulate additives for haze control (matt additive).

If a protective layer is used, it forms part of the spectrally controlling system (and thus part of the decorative coating) and as such its influence on the desired optical effect also needs to be accommodated, in the same manner as outlined above. Indeed, in the form of the invention where a protective layer is adopted, it would thus be the combined optical thickness of the protective layer plus the absorbing and transparent layers that would be selected such that the decorative coating achieved the desired optical effect.

For the absorbing layers of the spectrally controlling system, and as mentioned above, these are layers comprising a material, or a blend of materials, having a measured optical extinction coefficient greater than 1 in the spectral range of 400 to 1000 nm metals. Preferably, these materials are metals, metalloids, metal alloys or a mixture thereof that have a refractive index such that the sum of the refractive index and the extinction coefficient is greater than 2, while maintaining the extinction coefficient greater than 1. For the transparent layers of the spectrally controlling system, and again as mentioned above, these are layers comprising a material, or a blend of materials, having a measured optical extinction coefficient less than 1 in the spectral range of 400 to 1000 nm metals. Preferably, these materials are metals, metalloids, metal alloys (or a mixture thereof) that have a refractive index such that the sum of the refractive index and the extinction coefficient is less than 3, while maintaining the extinction coefficient less than 1.

In this form, the spectrally controlling system is an interference system made up of alternating layers of materials of different refractive indices, ideally with a relatively high refractive index contrast between adjacent layers. In this respect, such a refractive index contrast can be achieved by the selection of transparent layers of a material with a suitably low refractive index and absorbing layers of a material with a suitably high refractive index. In this respect, the difference in refractive index should be as high as possible to reduce overall film thicknesses required to produce the desired reflected colour. It is desirable to have the low refractive index material of the lowest possible of practical materials.

With this in mind, suitable materials for the absorbing layers may be selected from the group of metals, metalloids and metal alloys including: chromium, aluminium, titanium, nickel, molybdenum, zirconium, tungsten, silicon, niobium, tantalum, vanadium, cobalt, manganese, silver, zinc, indium, germanium, tin and mixtures thereof; and an oxide, nitride, boride, fluoride or carbide thereof, and mixtures thereof. Most preferably, at least one layer is chromium, or a chromium mixture, such as Cr—Zr, Cr—Ni or Cr—Mo, or carbides or nitrides thereof, such as Cr—N.

Suitable materials for the transparent layers may be selected from the group of metals, metalloids and metal alloys including: boron, silicon, germanium, antimony, tellurium, polonium, niobium, zirconium, magnesium, tin, tantalum, aluminium, chromium, titanium and mixtures thereof; and an oxide, nitride, boride, fluoride or carbide thereof, and mixtures thereof. Most preferably, at least one layer is formed from an oxide such as $SiO_2$.

Preferred deposition methods that may be adopted for applying the multiple layers of the spectrally controlling system to the stress controlling system can also be chosen from any suitable vacuum vapour deposition systems, such as thermal evaporation, electron beam evaporation (with or without ion beam assistance) or sputter deposition. Sputter deposition is the preferred method. Additionally, the surface of the plastic substrate may first be subjected to a surface treatment to improve adhesion between the stress controlling system and the spectrally controlling system. The surface treatment may be selected from any of plasma discharge, corona discharge, glow discharge and UV radiation.

The preferred optical thickness of each individual layer of the spectrally controlling system will of course depend on the desired optical effect. Therefore, for each different product, the expectation is that there will be a different set of "preferred optical thicknesses". Noting this, in a spectrally controlling system that is a four layer stack, such as in the example provided above, it is envisaged that the first CrZr layer might have a preferred physical thickness in a range between 2 and 40 nm. The second layer might have a physical preferred thickness in a range between 20 and 200 nm. The second layer might have a more preferred physical thickness in the range between 48 and 101 nm. The third layer might have a preferred physical thickness in a range between 2 and 40 nm. The third layer might have a more preferred physical thickness in a range between 6.7 and 25 nm. The fourth layer might have a preferred physical thickness in a range between 15 and 200 nm. The forth layer might have a more preferred physical thickness in a range between 15 and 40 nm.

Turning now to a description of the stress controlling system, as mentioned above the stress controlling system ideally consists of one or more layers of a material that can ensure that the overall residual stress of the decorative coating will be compressive (when measured in the absence of an optional protective layer) but also that will be compatible with the plastic substrate. In this respect, a "compatible" layer will be one that displays good adhesion to the plastic substrate.

In this respect, in this stress range it has been found that a coated substrate will exhibit good performance throughout durability tests, such as salt spray, thermal shock, dry heat, immersion and humidity tests. Throughout this specification, this range will be referred to as "the desired stress window". Having said that, an alternative range for the desired stress window is less than −6 MPa, or less than −63 MPa, or less than −76 MPa, or less than −100 MPa, or less than −110 MPa, or less than −112, or less than 160 MPa. Furthermore, the lower bounds of the stress window may be −360 MPa or greater, −359 MPa or greater, −300 MPa or greater, −250 MPa or greater, or −200 MPa or greater. Further combinations of these ranges are also contemplated by the present invention. For example the stress window may be between 0 MPa to −300 MPa; −63 MPa to −300 MPa, −75 MPa to −300 MPa, −110 MPa to −300 MPa or 0 MPa to −250 MPa etc.

As mentioned above, the stress controlling system is ideally used to balance the overall residual stress of the decorative coating, such that the overall residual stress is maintained in the desired stress window. In this respect, when the combined optical thickness of the absorbing layers and the transparent layers (and of the protective layer, if present) are selected such that the spectrally controlling system provides the desired optical effect, the stress controlling system needs to include a layer of a compressive stress of a suitable amount so as to maintain the overall residual stress of the decorative coating in the desired stress window.

Preferred deposition methods that may be adopted for applying the one or more layers of the stress controlling system to the plastic substrate can be chosen from any vacuum vapour deposition system, such as thermal evaporation, electron beam evaporation (with or without ion beam assistance) or sputter deposition. Sputter deposition is the preferred method. Additionally the surface of the substrate may first be subjected to a surface treatment to improve adhesion between the stress controlling system and the substrate. The surface treatment may be selected from any of plasma discharge, corona discharge, glow discharge and UV radiation.

In one form, the stress controlling system can be tuned to achieve the desired stress window by optimising the deposition parameters of one or more of its layers. These parameters include sputter power, gas pressure, nitrogen gas doping and coating thickness. Stress can also be tuned to be more compressive (or less tensile) by introducing a thermal stress component by way of substrate heating, or by conducting a pretreatment process directly before the deposition of the stress controlling system. The interaction of the stress controlling system with the spectrally controlling system is complex and the tuning of the overall residual stress is ideally conducted with reference to the entire decorative coating being a complete coating 'stack'.

In this respect, the overall residual stress is the measured stress profile of the stress controlling system and spectrally controlling system (without the protective layer, even when such a protective layer will be utilised) as a complete stack deposited on a glass microscope cover slide. The stress measurement is obtained by placing the glass slide into a stress measurement device (such as a Sigma Physik SIG-500SP) before and after coating deposition.

Typically, there is little scope to tune the stress in the spectrally controlling system as the layers need to maintain near perfect (and consistent) composition to achieve the desired optical effect, meaning the resultant stresses in the spectrally controlling system tend not to be controllable and will be tensile or sometimes only slightly compressive. It is thus the stress controlling system that is tuned to bring the overall residual stress of the decorative coating into the desired stress window. If, for example, the spectrally controlling system is highly tensile, the stress controlling system will need to be compressive in stress and of a higher magnitude to achieve the desired stress window.

The stress controlling system will preferably be a single layer of a material which, when deposited, produces a high level of compressive stress. Materials known for their compressive stress are $SiO_x$, $SiO_xN_y$, $CrN_x$, $NbO_x$, $TaO_x$, and $ZrO_x$, where x and y are both preferably between 0.1 and 2.0.

The stress controlling system may be a multilayer system, which may be required when the preferred stress controlling layer is not compatible (displays poor adhesion) with the substrate. In this case, a compressive or slightly tensile compatible layer would be deposited on the substrate and then a highly compressive layer would be deposited on top. Examples of a multilayer system could be $CrN/Nb_2O_5$. It is envisaged that such a multilayer stress controlling system would obtain a highly compressive stress which is compatible with the substrate.

It will thus be apparent that when the desired optical effect is required to be altered to be another desired optical effect, such as by making different optical thickness selections for either or both of the absorbing layers and the transparent layers of the spectrally controlling system to give rise to a different colour, concomitant changes will likely also be required for the stress controlling system to ensure that the overall residual stress of the decorative coating is maintained in the desired residual stress window.

The present invention thus also provides a method for applying a decorative coating to a plastic substrate, the decorative coating providing the coated substrate with a desired optical effect, the decorative coating including a spectrally controlling system and a stress controlling system, the spectrally controlling system being multiple layers and optionally including a protective layer, and the stress controlling system being at least a single layer, wherein the multiple layers of the spectrally controlling system are absorbing layers alternating with transparent layers, the method including:

a) determining the desired optical effect;

b) determining a suitable spectrally controlling system that will provide the desired optical effect, with reference to a required optical thickness for the spectrally controlling system;

c) determining a suitable stress controlling system that has a compressive stress of an amount such that the overall residual stress of the decorative coating compressive when measured in the absence of the optional protective layer;

d) coating the suitable stress controlling system upon the plastic substrate;

e) coating the suitable spectrally controlling system upon the stress controlling system; and f) thereby forming a coated plastic substrate with the desired optical effect.

The plastic substrate of the present invention may be formed from any suitable plastic material. For example, a plastic substrate may be formed from a material selected from the group including polyacrylate, polyester, polystyrene, polyethylene, polypropylene, polyamides, polyamides, polycarbonate, epoxy, phenolic, acrylonitrile-butadiene-styrene, acrylonitrile-styrene-acrylates, acetal and blends of these. Preferred plastic substrate materials include polycarbonate, poly (2,2'-dihydroxyphenylpropane) carbonate, polydiethyleneglycol bis(allyl carbonate), polymethylmethacrylate and polystyrene, or blends thereof. In preferred forms, the substrate will typically have a physical thickness in the range of 0.1 mm to 20 mm, more preferably in the range of 1 mm to 5 mm, and most preferably in the range of 2 mm to 3 mm.

A product bearing the decorative coating of the present invention may also include other coatings either between the decorative coating and the substrate, within the decorative coating, such as the protective layer mentioned above that can optionally be a part of the spectrally controlling system of the decorative coating, or be upon the decorative coating. In particular, it is envisaged that in some embodiments it will be advantageous to include a hardcoating between the decorative coating and the substrate. In this form, the hardcoating is a protective layer which does not contribute to the overall desired optical effect, while in other embodiments an external protective layer upon the decorative coating will itself be a hardcoating.

In this respect, a coating that is said to be a "hardcoating" is a coating that is harder and stiffer than the substrate, whereby it increases the abrasion resistance of that substrate. Such an abrasion resistant hard coating is one that reduces damage due to impacts and scratching. Abrasion resistance can be measured through tests such as ASTM F735 "Standard Test Method for Abrasion Resistance of Transparent Plastics and Coatings Using the Oscillating Sand Method", ASTM D4060 "Standard Test Method for Abrasion Resistance of Organic Coatings", by the Taber Abrader, or by using the well-known Steelwool Test.

Furthermore, some plastic substrates can be damaged by certain solvents; for example, polycarbonate is damaged by acetone. It is a requirement for many products that might be suited to the decorative coating of the present invention that they be "chemically resistant", which is a reference to an ability to withstand exposure to normal solvents such as diesel fuel, petroleum, battery acid, brake fluid, antifreeze, acetone, alcohol, automatic transmission fluid, hydraulic oil and ammonia based window cleaners. In this respect, it will be appreciated that a hardcoating ideally provides a product bearing the decorative coating of the present invention with such chemical resistance.

A hardcoating is preferably formed from one or more abrasion resistant layers, and may include a primer layer that bonds well to a plastic substrate and forms a preferable material for subsequent abrasion resistant layers. The primer layer may be provided by any suitable material and may for example be an organic resin such as an acrylic polymer, a copolymer of acrylic monomer and methacryloxysilane, or a copolymer of a methacrylic monomer and an acrylic monomer having a benzotriazole group or benzophenone group. These organic resins may be used alone or in combinations of two or more.

[1] The abrasion resistant layers are preferably formed from one or more materials selected from the group consisting of an organo-silicon, an acrylic, a urethane, a melamine or an amorphous $SiO_xC_yH_2$. Most preferably, the abrasion resistant layer is an organo-silicon layer, due to its superior abrasion resistance and compatibility with physical vapour deposited films. For example, an abrasion resistant layer comprising an organo-silicon polymer can be formed by forming a layer of a compound selected from the following compounds by a method such as dip coating or the like and then curing the layer: trialkoxysilanes or triacyloxysilanes such as methyltrimethoxysilane, methyltriethoxysilane, methyltrimethoxyethoxysilane, methyltriacetoxysilane, methyltripropoxysilane, methyltributoxysilane, ethyltrimethoxysilane, ethyltriethoxysilane, vinyltrimethoxysilane, vinyltriethoxysilane, vinyltriacetoxysilane, vinyltrimethoxyethoxysilane, phenyltrimethoxysilane, phenyltriethoxysilane, phenyltriacetoxysilane, gamma-chloropropyltrimethoxysilane, gamma-chloropropyltriethoxysilane, gamma-chloropropyltripropoxysilane, 3,3,3-trifluoropropyltrimethoxysilane gamma-glycidoxypropyltrimethoxysilane, gamma-glycidoxypropyltriethoxysilane, gamma-(beta-glycidoxyethoxy)propyltrimethoxysilane, beta-(3,4-epoxycyclohexyl)ethyltrimethoxysilane, beta-(3,4-epoxycyclohexyl)ethyltriethoxysilane, gamma-methacryloxypropyltrimethyoxysilane, gamma-aminopropyltrimethoxysilane, gamma-aminopropyltriethoxysilane, gamma-meraptopropyltrimethoxysilane, gamma-mercaptopropyltriethoxysilane, N-beta(aminoethyl)-gamma-aminopropyltrimethoxysilane, beta-cyanoethyltriethoxysilane and the like; as well as dialkoxysilanes or diacyloxysilanes such as dimethyldimethoxysilane, phenylmethyldimethoxysilane, dimethyldiethoxysilane, phenylmethyldiethoxysilane, gamma-glycidoxypropylmethyldimethoxysilane, gamma-glycidoxypropylmethyldiethoxysilane, gamma-glycidoxypropylphenyldimethoxysilane, gamma-glycidoxypropylphenyldiethoxysilane, gamma-chloropropylmethyldimethoxysilane, gamma-chloropropylmethyldiethoxysilane, dimethyldiacetoxysilane, gamma-methacryloxypropylmethyldimethoxysilane, gamma-metacryloxypropylmethyldiethoxysilane, gamma-mercaptopropylmethyldimethoxysilane, gamma-mercaptopropylmethyldiethoxysilane, gamma-aminopropylmethyldimethoxysilane, gamma-aminopropylmethyldiethoxysilane, methylvinyldimethoxysilane, methylvinyldiethoxysilane and the like.

The abrasion resistant layers may be coated onto a plastic substrate by dip coating in liquid followed by solvent evaporation, or by plasma enhanced chemical vapour deposition (PECVD) via a suitable monomer. Alternative deposition techniques such as flow coating and spray coating are also suitable. To improve the abrasion resistance of the hardcoating, subsequent coatings of the abrasion resistant layer may be added, preferably within a 48 hour period to as to avoid aging and contamination of the earlier coatings.

The thickness of an abrasion resistant layer is preferably selected to assist in providing adequate abrasion resistance. In this respect, adequate abrasion resistance is regarded herein as being a Bayer abrasion ratio of 5 with respect to an uncoated plastic substrate (such as a polycarbonate), or alternatively by a Taber abrasion test with delta haze less than 15% after testing with a 500 g load and CS10F wheel at 500 cycles, (% haze being measured as per ASTM D1003). With these requirements met, when an organo-silicon is used as an abrasion resistant layer, the thickness of the hardcoating is preferably in the range of from about 1 to about 15 microns, and is most preferably between 3 and 7 microns.

A refinement to the visual appearance can be achieved by patterning the substrate. For example, through the use of a patterned injection mould, a pattern can be formed on the front surface of a substrate. An example of a desirable optical effect is to replicate brushed stainless steel, and it has been found that parallel lines of random length (between 1 and 5 cm) positioned closely adjacent each other can achieve this appearance when subsequently coated with the present invention.

A further refinement to improve the visual comparison to brushed stainless steel is the incorporation of a matting additive to a hardcoating protective layer which is applied to a patterned substrate. In this respect, it is known that a matt effect is achieved due to the uneven surface produced by the small (usually ~5 μm) particles of a matt additive. By alteration of the protective layer through the addition of matting additives to the hardcoat, a "satin" appearance can also be achieved. This is characterised by a significant diffuse reflected component (Diffuse Reflection ~between 10% and 30%, preferably 16% and a Specular Reflection of ~8%).

In a further form of the present invention, the decorative coating may be overcoated with a protective layer to further enhance the abrasion resistance or to assist with the cleanability of the coated product. For example, a protective layer may be formed from a material exhibiting the following characteristics, including hydrophobic, hydrophilic, lipophobic, lipophilic and oleophobic characteristics or combinations thereof, and may include a hardcoating (with or without a matting additive (particles)) such as that mentioned above.

In terms of possible uses for a decoratively coated plastic substrate in accordance with the present invention, as foreshadowed above the coated plastic substrates can be used as designer surfaces on a variety of consumer goods including premium automotive interior and exterior trim components, consumer and household goods, as well as fashionable household electronic products, and either as partial or full surfaces for those goods.

Also, the coated plastic substrates are able to provide illuminated patterns for products, sometimes referred to as "hidden 'til lit", and back lighting in general, in suitable situations. In this respect, a desired optical effect can be achieved by selecting the correct % R and % T such that a light can be shone through a coating to produce an illuminated pattern. However, when the rear illumination is not present, the visual appearance of the product is such that it appears uniform, such that there is no visible pattern present.

Various aspects of this invention will become apparent to those skilled in the art from the following detailed description of the preferred embodiment, when read in light of the accompanying drawings.

DETAILED DESCRIPTION OF THE PREFERRED EMBODIMENTS

Figure 1:
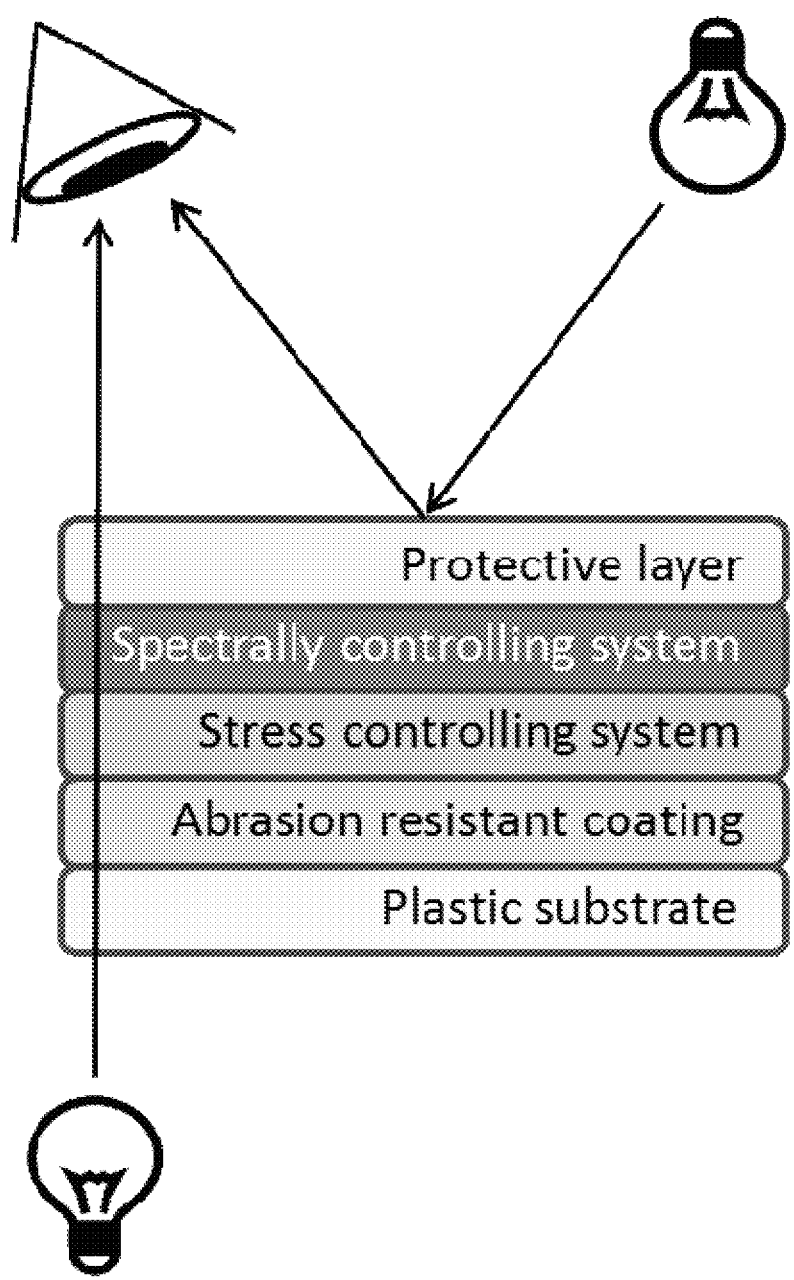
FIG. 1 is a schematic representation of a coated plastic substrate in accordance with a first preferred embodiment of the present invention, showing the decorative coating in terms of its spectrally controlling system and its stress controlling system.

Before providing a more detailed description of various preferred embodiments of the present invention, with reference to various examples, it will be useful to provide some explanation of the role and measurement of stress in multiple layer coatings of the type of the present invention.

In terms of being able to control internal stress parameters, ideally the stress of the entire decorative coating will be controlled, in both magnitude and mode. In this respect, and throughout this specification, the term "differential stress" is to be taken as meaning the difference in stress between the stress controlling system and the spectrally controlling system, which is representative of the interfacial strain experienced at the interface between them. The term "overall residual stress" is to be taken as meaning the combined stress of the stress controlling system and the spectrally controlling system, which might thus be regarded as the resultant or absolute stress, as measured in the absence of the optional protective layer.

Many coating layers are tensile at room temperature, which, when applied to plastic substrates, craze when exposed to elevated temperatures such as 85° C. (an auto industry standard). It appears that this is due to the difference in coefficient of thermal expansion (CTE) between such layers (typically being in the range of $7 \times 10^{-6}$ mm/mm/° C. to $20 \times 10^{-6}$ mm/mm/° C.) and plastic substrates (typically being in the range of $40 \times 10^{-6}$ mm/mm/° C. to $70 \times 10^{-6}$ mm/mm/° C.), where the plastic substrate expands significantly more than the layer when heated. By applying a compressive layer with stress of a greater magnitude, a reduction in tensile stress is achieved and this has been found to prevent crazing occurring during exposure to the abovementioned temperatures and thermal shocks.

When coating a plastic substrate with the decorative coating of the present invention, the overall residual stress of the decorative coating (that is the combined stress of the stress controlling system and the spectrally controlling system) is preferably controlled such that it falls within the desired stress window. However, to assist with this control, it is helpful for the stress ranges of the individual layers to be known, so that when they are combined into a decorative coating they result in the desired overall residual stress.

In relation to the distinction between "measured" stress values and "calculated" stress values, it will be appreciated that both differential stress and residual stress can be calculated for any given coating system. In this respect, reference is made to the applicant's co-pending International patent publication WO2011/075796 A1, the full content of which is herein incorporated by this reference, for a full description of suitable methods for determining values for "differential stress" and "residual stress" and for calculating stress.

EXAMPLES

Example 1—Desired Optical Effect—Piano Black Spectrally Reflected Appearance with High % T An injection moulded polycarbonate substrate is first cleaned through a commercial ultrasonic cleaning system with detergent. A final rinse in distilled water is required in a clean (dust free) environment. The substrate is then dip coated in a Momentive PHC-587B at a withdrawal rate of 10 mm/s. A flash-off time of 10 minutes allows solvents to slowly evaporate and the part to be largely tack free. The substrate is then moved to a curing oven for 45 minutes at 130° C. Subsequent coatings are performed within a 48 hour period so as to avoid aging/contamination of the hardcoating.

The substrate is loaded into a batch type vacuum sputter coater, (PylonMET VXL) which consists of a single coating chamber in which the samples are placed, evacuated and coated. Within this chamber the samples were evacuated to a pressure below $8 \times 10^{-5}$ mbar. There was a target to substrate distance of 110 mm and the following were the deposition conditions:

Plasma Pre-Treatment Step

| 40 kHz Dual electrode Antenna | Power 3 kW |
|---|---|
| Total Gas flow | Argon 800 sccm |
| | Oxygen 100 sccm |
| RPM | 6 |
| Number of rounds | 12 |
| Base Pressure (mbar) | 8e–5 |
| Run Pressure (mbar) | 1e–2 |

Stress Controlling System

| | Layer 1 |
|---|---|
| Dual rotatable Silicon Target 99.90% | Power 35 kW @ 27 kHz |
| Total Gas flow | Argon 160 sccm |
| | Oxygen 302 sccm |
| RPM | 8.4 |
| Number of rounds | 36 |
| Base Pressure (mbar) | 2e–5 |
| Run Pressure (mbar) | 2e–3 |
| Thickness (nm) | 250 |

Spectrally Controlling System

| | Layer 1 | Layer 2 | Layer 3 | Layer 4 |
|---|---|---|---|---|
| Dual rotatable Silicon Target 99.90% | — | Power 21 kW | — | Power 21 kW |
| Chrome Zirconium Target 98.5%/1.5% | Power 9.5 kW | — | Power 9.5 kW | — |

-continued

|  | Layer 1 | Layer 2 | Layer 3 | Layer 4 |
|---|---|---|---|---|
| Total Gas flow | Argon 240 sccm | Argon 96 sccm Oxygen 202 sccm | Argon 240 sccm | Argon 96 sccm Oxygen 202 sccm |
| RPM | 24 | 24 | 24 | 24 |
| Number of rounds | 10 | 70 | 5 | 35 |
| Base Pressure (mbar) | 2e−5 | 2e−5 | 2e−5 | 2e−5 |
| Run Pressure (mbar) | 2e−3 | 2e−3 | 2e−3 | 2e−3 |
| Thickness (nm) | 9.7 | 87 | 6.7 | 40 |

Protective Layer

|  | Layer 1 |
|---|---|
| 40 kHz Dual electrode Antenna | 5 kW |
| Total Gas flow | HMDSO 210 sccm |
| RPM | 20 |
| Number of rounds | 8 |
| Base Pressure (mbar) | 2e−5 |
| Run Pressure (mbar) | 4e−2 |
| Thickness (nm) | 8 |

The measured residual stress of layers was determined, the durability performance was tested, and the actual optical measurements obtained. The results are set out in Tables 1, 2 and 3 below.

TABLE 1

Measured stress of the layers

| Layer | Stress |
|---|---|
| Stress controlling system | −260 MPa |
| Total residual stress | −176 MPa |

TABLE 2

Durability Performance

|  | Test Duration | Result |
|---|---|---|
| Abrasion resistance (Bayer) | 300 cycles | Abrasion ratio = 12 |
| Scratch resistance (Steel ball test) | Rating 2 @ 2N | Pass |
| Salt spray | 288 hrs | Pass |
| Thermal Shock | 200 cycles | Pass |
| Dry heat Test | 115° C. | Pass |
| Accelerated UV weathering (SAE J1960) | 2500 kJ/m² | Pass |

TABLE 3

Optical Measurement Data (Desired Optical Effect)

| Photopic reflection | Y = 4.3% |
|---|---|
| Photopic transmission | Y = 13.9% (tinted PMMA 15.03) |
| Reflected colour target on transparent substrate - CIE L*a*b* scale measured with illuminant A/2 | L* = 24.6 a* = −6 b* = −8.6 |
| Transmitted colour target on transparent substrate - CIE L*a*b* scale measured with illuminant A/2 | L* = 44 (tinted PMMA 46) a* = 5.7 (tinted PMMA 4.6) b* = 2.6 (tinted PMMA −1.3) |

Example 2—Desired Optical Effect—Bright Chrome with High % T

A process generally as described in Example 1 is employed, with the following alterations.

Spectrally Controlling System

|  | Layer 1 | Layer 2 |
|---|---|---|
| Material | CrZr | SiO2 |
| Thickness (nm) | 25 | 15 |

The measured residual stress of layers was determined, the durability performance was tested, and the actual optical measurements obtained. The results are set out in Tables 4, 5 and 6 below.

TABLE 4

Measured stress of the layers

| Layer | Stress |
|---|---|
| Stress controlling system | −260 MPa |
| Total residual stress | −160 MPa |

TABLE 5

Durability Performance

|  | Test Duration | Result |
|---|---|---|
| Abrasion resistance (Bayer) | 300 cycles | Abrasion ratio = 15 |
| Thermal Shock | 200 cycles | Pass |
| Dry heat Test | 115° C. | Pass |
| Accelerated UV weathering (SAE J1960) | 2500 kJ/m² | Pass |

TABLE 6

Optical Measurement Data (Desired Optical Effect)

| Photopic reflection | Y = 55.3% |
|---|---|
| Photopic transmission | Y = 7.2% |
| Reflected colour target on transparent substrate - CIE L*a*b* scale measured with illuminant A/2 | L* = 79.2 a* = −0.8 b* = 0.72 |
| Transmitted colour target on transparent substrate - CIE L*a*b* scale measured with illuminant A/2 | L* = 32.3 a* = 2.6 b* = 3.9 |

Example 3—Desired Optical Effect—Opaque Gun Metal (for Illuminated Patterns)

Figure 2:
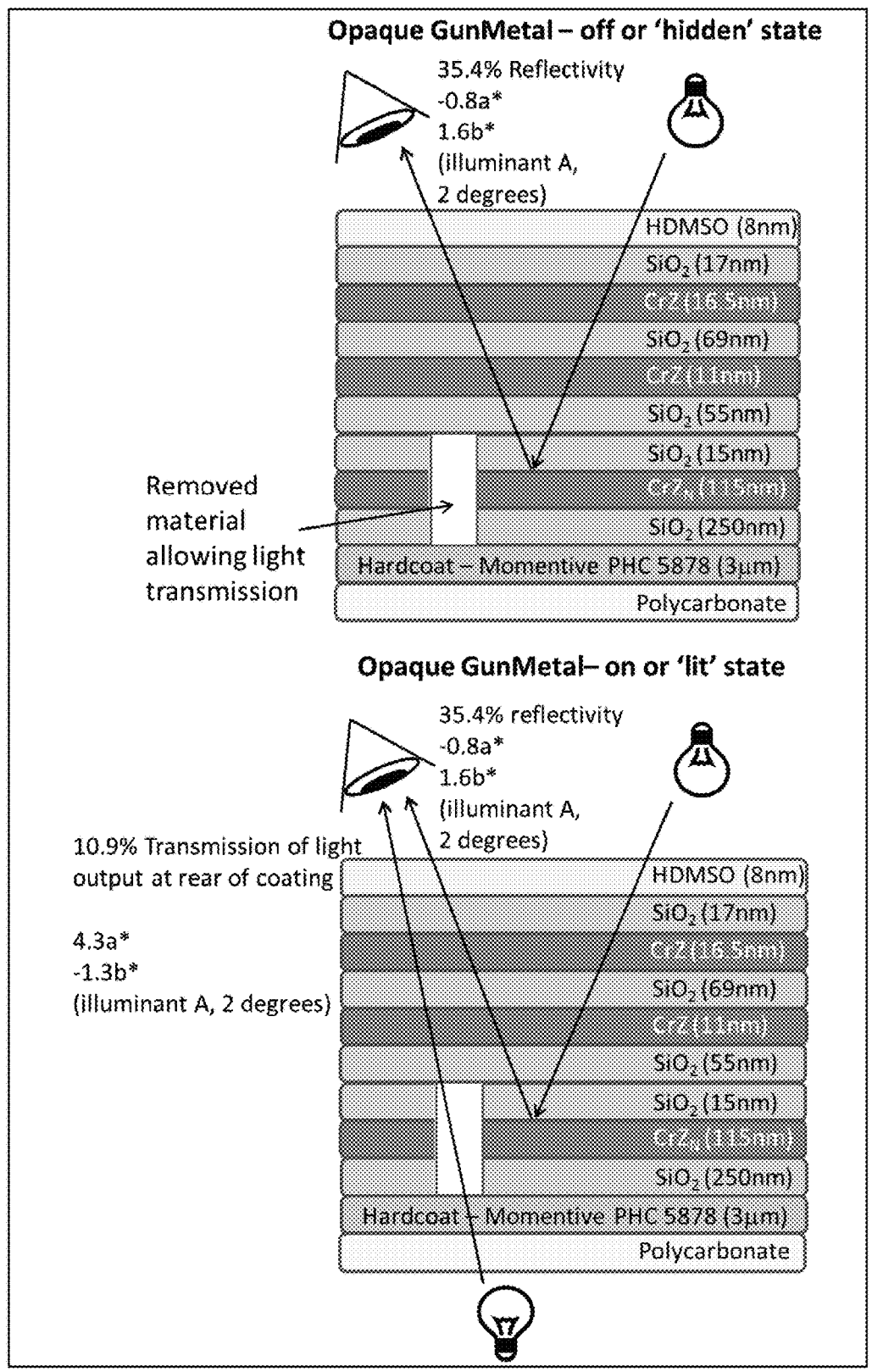
FIGS. 2 and 3 are schematic representations of a coated plastic substrate in accordance with a second preferred embodiment of the present invention, representative of the products of Examples 2 and 3 below (showing the "hidden 'til lit" functionality of the present invention).

A process generally as described in Example 1 is employed, with the following alterations. However, it should also be noted that the sample is 'vented' between application of the stress controlling system and the spectrally controlling system for metal ablation/removal to enable the illuminated pattern (also referred to as "hidden 'til lit") functionality. A schematic representation of a coated substrate in accordance with this embodiment is illustrated in FIG. 2.

Stress Controlling System

|  | Layer 1 | Layer 2 | Layer 3 |
| --- | --- | --- | --- |
| Dual rotatable Silicon Target 99.90% | Power 35 kW @ 27 kHz | — | Power 31 kW @ 27 kHz |
| Chrome Zirconium Target 98.5%/1.5% | — | Power 60 kW | — |
| Total Gas flow | Argon 160 sccm Oxygen 302 sccm | Argon 150 sccm Nitrogen 90 sccm | Argon 96 sccm Oxygen 202 sccm |
| RPM | 8.4 | 24 | 24 |
| Number of rounds | 36 | 34 | 3 |
| Base Pressure (mbar) | 2e−5 | 2e−5 | 2e−5 |
| Run Pressure (mbar) | 2e−3 | 2e−3 | 2e−3 |
| Thickness (nm) | 250 | 115 | 15 |

Spectrally Controlling System

|  | Layer 1 | Layer 2 | Layer 3 | Layer 4 | Layer 5 |
| --- | --- | --- | --- | --- | --- |
| Material | SiO2 | CrZr | SiO2 | CrZr | SiO2 |
| Thickness (nm) | 55 | 11 | 69 | 16.5 | 17 |

The measured residual stress of layers was determined and the actual optical measurements obtained. The results are set out in Tables 7 and 8.

TABLE 7

Measured stress of the layers

| Layer | Stress |
| --- | --- |
| Stress controlling system | −141 MPa |
| Total residual stress | −125 MPa |

TABLE 8

Optical Measurement Data - Desired Optical Effect

| | |
| --- | --- |
| Photopic reflection | Y = 35.4% |
| Photopic transmission | Y = 0% (10.9% 'hidden' portion) |
| Reflected colour target on transparent substrate - CIE L*a*b* scale measured with illuminant A/2 | L* = 66<br>a* = −0.8<br>b* = 1.6 |
| Transmitted colour target on transparent substrate - CIE L*a*b* scale measured with illuminant A/2 | L* = 0 (39 'hidden' portion)<br>a* = 0 (4.3 'hidden' portion)<br>b* = 0 (−1.3 'hidden' portion) |

Example 4—Desired Optical Effect—Gun Metal (High % T)

A process generally as described in Example 1 is employed, with the following alterations. This product has a similar appearance from the front as in Example 3, however light can be more readily transmitted through it to achieve an added desired optical effect, which might be to cover a display screen or 'hidden' lighting.

Spectrally Controlling System

|  | Layer 1 | Layer 2 | Layer 3 | Layer 4 |
| --- | --- | --- | --- | --- |
| Material | CrZr | SiO2 | CrZr | SiO2 |
| Thickness (nm) | 5 | 101 | 9 | 17 |

The measured residual stress of layers was determined, the durability performance was tested, and the actual optical measurements obtained. The results are set out in Tables 9, 10 and 11.

TABLE 9

Measured stress of the layers

| Layer | Stress |
| --- | --- |
| Stress controlling system | −260 MPa |
| Total residual stress | −171 MPa |

TABLE 10

Durability Performance

|  | Test Duration | Result |
| --- | --- | --- |
| Abrasion resistance (Bayer) | 300 cycles | Abrasion ratio = 12 |
| Scratch resistance (Steel ball test) | Rating 2 @ 2N | Fail |
| Salt spray | 288 hrs | Pass |
| Thermal Shock | 200 cycles | Pass |
| Dry heat Test | 115° C. | Pass |
| Accelerated UV weathering (SAE J1960) | 2500 kJ/m$^2$ | Pass |

TABLE 11

Optical Measurement Data (Desired Optical Effect)

| | |
| --- | --- |
| Photopic reflection | Y = 22.4% |
| Photopic transmission | Y = 11% |
| Reflected colour target on transparent substrate - CIE L*a*b* scale measured with illuminant A/2 | L* = 54.4<br>a* = −0.7<br>b* = 2.5 |
| Transmitted colour target on transparent substrate - CIE L*a*b* scale measured with illuminant A/2 | L* = 40<br>a* = 4.3<br>b* = −1.3 |

Example 5—Desired Optical Effect—Brushed Stainless Steel Effect

This example provides a patterned substrate, together with a hardcoat as a protective layer, with the hardcoat including a matt additive. In this respect, a patterned injection mould tool is used to injection mould a patterned polycarbonate substrate.

The substrate is spray coated in a Momentive PHC-587B with Exxene S-44HRD additive at a 9% wt/vol concentration, which was further diluted by IPA at 30% vol. The thickness was between 0.5 and 4 μm as measured in the valleys and peaks respectively of the matt hardcoat by profilometry.

Stress Controlling System

|  | Layer 1 |
| --- | --- |
| Dual rotatable Silicon Target 99.90% | Power 35 kW @ 27 kHz |
| Total Gas flow | Argon 160 sccm |
|  | Oxygen 302 sccm |
| RPM | 8.4 |
| Number of rounds | 14 |
| Base Pressure (mbar) | 2e−5 |
| Run Pressure (mbar) | 2e−3 |

Spectrally Controlling System

|  | Layer 1 | Layer 2 |
| --- | --- | --- |
| Material | CrZrN | SiO2 |
| Thickness (nm) | 30 | 35 |

Protective Layer

|  | Layer 1 |
| --- | --- |
| Material | Hardcoat - Momentive PHC 587B |
| Deposition method | Dip Coated and cured at 130° C. |
| Thickness (μm) | 8 |

The measured residual stress of layers was determined, the durability performance was tested, and the actual optical measurements obtained. The results are set out in Tables 12, 13 and 14.

TABLE 12
Measured stress of the layers

| Layer | Stress |
| --- | --- |
| Stress controlling system | −180 MPa |
| Total residual stress | −112 MPa |

TABLE 13
Durability Performance

|  | Test Duration | Result |
| --- | --- | --- |
| Abrasion resistance (Bayer) | 300 cycles | Abrasion ratio = 9 |
| Salt spray | 288 hrs | Pass |
| Thermal Shock | 200 cycles | Pass |
| Dry heat Test | 115° C. | Pass |
| Accelerated UV weathering (SAE J1960) | 2500 kJ/m$^2$ | Pass |

TABLE 14
Optical Measurement Data (Desired Optical Effect)

| Photopic reflection | Y = %38.9 |
| --- | --- |
| Photopic transmission | Y = %7.2 (0 actual stainless steel) |

TABLE 14-continued
Optical Measurement Data (Desired Optical Effect)

| Reflected colour target on transparent substrate - CIE L*a*b* scale measured with illuminant A/2 | L* = 69 |
| --- | --- |
|  | a* = 0.9 |
|  | b* = 4.1 |
| Transmitted colour target on transparent substrate - CIE L*a*b* scale measured with illuminant A/2 | L* = 32 (0 actual stainless steel) |
|  | a* = 1.5 (0 actual stainless steel) |
|  | b* = 3.2 (0 actual stainless steel) |

Example 6—Desired Optical Effect—Satin Chrome Effect

A process generally as described in Example 1 is employed, with the following alterations. Additionally, a matt additive is included in a hardcoat as a protective layer to achieve a desired diffuse reflection.

Stress Controlling System

|  | Layer 1 |
| --- | --- |
| Dual rotatable Silicon Target 99.90% | Power 35 kW @ 27 kHz |
| Total Gas flow | Argon 160 sccm |
|  | Oxygen 302 sccm |
| RPM | 8.4 |
| Number of rounds | 60 |
| Base Pressure (mbar) | 2e−5 |
| Run Pressure (mbar) | 2e−3 |
| Thickness (nm) | 250 |

Spectrally Controlling System

|  | Layer 1 | Layer 2 |
| --- | --- | --- |
| Material | CrZr | SiO2 |
| Thickness (nm) | 25 | 15 |

Protective Layer

|  | Layer 1 |
| --- | --- |
| Material | Momentive PHC-587B + Tospearl (XX) at a 6% wt/vol |
| Deposition Method | Spray Coated and cured at 130° C. |
| Thickness (μm) | 1 to 6 |

The measured residual stress of layers was determined, the durability performance was tested, and the actual optical measurements obtained. The results are set out in Tables 15, 16 and 17.

TABLE 15
Measured stress of the layers

| Layer | Stress |
| --- | --- |
| Stress controlling system | −200 MPa |
| Total residual stress | −160 MPa |

TABLE 16

Durability Performance

| | Test Duration | Result |
|---|---|---|
| Abrasion resistance (Bayer) | 300 cycles | Abrasion ratio = 9 |
| Salt spray | 288 hrs | Pass |
| Thermal Shock | 200 cycles | Pass |
| Dry heat Test | 115° C. | Pass |

TABLE 17

Optical Measurement Data (Desired Optical Effect)

| | |
|---|---|
| Photopic Total reflection | Y = 43.7% |
| Photopic Specular reflection | Y = 15.6% |
| Photopic Diffuse reflection | Y = 28.1% |
| Photopic transmission | Y = 7.2% (0% electroplated satin chrome) |
| Reflected colour target on transparent substrate - CIE L*a*b* scale measured with illuminant A/2 | L* = 72<br>a* = −1.5<br>b* = −0.7 |
| Transmitted colour target on transparent substrate - CIE L*a*b* scale measured with illuminant A/2 | L* = 32.3 (0 electroplated satin chrome)<br>a* = 2.6 (0 electroplated satin chrome)<br>b* = 3.9 (0 electroplated satin chrome) |

Example 7—Desired Optical Effect—Bright Chrome with Correct % T (Non-Conducting for IR and rf Transparency)

A process generally as described in Example 1 is employed, with the following alterations. In particular, the samples were loaded into a custom built coating chamber, which consisted of three sputter targets where two of the targets were arranged to achieve co-sputtering.

Stress Controlling System

| | Layer 1 |
|---|---|
| Silicon Target 99.95% | Power 1 kW |
| Total Gas flow | Argon 26 sccm<br>Oxygen 12 sccm |
| RPM | 150 |
| Base Pressure (mbar) | 2e−5 |
| Run Pressure (mbar) | 2e−3 |
| Thickness (nm) | 44 |

Spectrally Controlling System

| | Layer 1 | Layer 2 | Layer 3 | Layer 4 |
|---|---|---|---|---|
| Material | Si/Al alloy | SiO2 | Si/Al Alloy | SiO2 |
| Silicon Target 99.95% | Power 1 kW | Power 1 kW | Power 1 kW | Power 1 kW |
| Aluminium Target 99.95% | Power 80 W | — | Power 80 W | — |
| Gas flow | Argon 26 sccm | Argon 26 sccm<br>Oxygen 12 sccm | Argon 26 sccm | Argon 26 sccm<br>Oxygen 12 sccm |
| Thickness (nm) | 21 | 15 | 2 m | 10 |

Protective Layer

| | Layer 1 |
|---|---|
| Material | HMDSO 150 sccm |
| Thickness (nm) | 8 |

The measured residual stress of layers was determined and the actual optical measurements obtained. The results are set out in Tables 18 and 19.

TABLE 18

Measured stress of the layers

| Layer | Stress |
|---|---|
| Measured Residual Stress | −359 MPa |

TABLE 19

Optical Measurement Data (Desired Optical Effect)

| | |
|---|---|
| Photopic reflection | Y = 50.7% |
| Photopic transmission | Y = 25.8% |
| Reflected colour target on transparent substrate - CIE L*a*b* scale measured with illuminant A/2 | L* = 76.4<br>a* = −1.9<br>b* = −1.2 |
| Transmitted colour target on transparent substrate - CIE L*a*b* scale measured with illuminant A/2 | L* = 57.9<br>a* = −8.0<br>b* = −16.5 |

Example 8—Desired Optical Effect—Piano Black with High % T on a Tinted Substrate A process generally as described in Example 1 is employed, with the following alterations. In particular, a 'tinted' polycarbonate is achieved by mixing clear Lexan LS2 with a prescribed amount of black Lexan 141 to achieve 49% optical transmission prior to injection moulding of the substrate.

Spectrally Controlling System

| | Layer 1 | Layer 2 | Layer 3 | Layer 4 |
|---|---|---|---|---|
| Material | CrZr | SiO2 | CrZr | SiO2 |
| Thickness (nm) | 9.7 | 87 | 6.7 | 40 |

Protective Layer

|  | Layer 1 |
| --- | --- |
| Material | HMDSO 210 sccm |
| Thickness (nm) | 8 |

The measured residual stress of layers was determined, the durability performance was tested, and the actual optical measurements obtained. The results are set out in Tables 20, 21 and 22.

TABLE 20

| Measured stress of the layers | |
| --- | --- |
| Layer | Stress |
| Stress controlling layer | −260 MPa |
| Total residual stress | −176 MPa |

TABLE 21

| Durability Performance | | |
| --- | --- | --- |
|  | Test Duration | Result |
| Abrasion resistance (Bayer) | 300 cycles | Abrasion ratio = 12 |
| Scratch resistance (Steel ball test) | Rating 2 @ 2N | Pass |
| Salt spray | 288 hrs | Pass |
| Thermal Shock | 200 cycles | Pass |
| Dry heat Test | 115° C. | Pass |
| Accelerated UV weathering (SAE J1960) | 2500 kJ/m² | Pass |

TABLE 22

| Optical Measurement Data (Desired Optical Effect) | |
| --- | --- |
| Photopic reflection | Y = 4.3% |
| Photopic transmission | Y = 5.8% |
| Reflected colour target on transparent substrate - CIE L*a*b* scale measured with illuminant A/2 | L* = 24.6<br>a* = −6<br>b* = −8.6 |
| Transmitted colour target on transparent substrate - CIE L*a*b* scale measured with illuminant A/2 | L* = 29.6<br>a* = 4.3<br>b* = −4.3 |

Example 9—Desired Optical Effect—Blue Chrome

A process generally as described in Example 1 is employed, with the following alterations.

Stress Controlling System

|  | Layer 1 |
| --- | --- |
| Dual rotatable Silicon Target 99.90% | Power 21 kW @ 27 kHz |
| Total Gas flow | Argon 160 sccm<br>Oxygen 302 sccm |
| RPM | 24 |
| Number of rounds | 21 |
| Base Pressure (mbar) | 2e−5 |
| Run Pressure (mbar) | 2e−3 |
| Thickness (nm) | 29 |

Spectrally Controlling System

|  | Layer 1 | Layer 2 | Layer 3 | Layer 4 |
| --- | --- | --- | --- | --- |
| Material | CrZr | SiO2 | CrZr | SiO2 |
| Thickness (nm) | 25 | 93 | 12 | 114 |

The measured residual stress of layers was determined, the durability performance was tested, and the actual optical measurements obtained. The results are set out in Tables 23, 24 and 25.

TABLE 23

| Measured stress of the layers | |
| --- | --- |
| Layer | Stress |
| Stress controlling layer | −20 MPa |
| Total residual stress | 41 MPa |

TABLE 24

| Durability Performance | | |
| --- | --- | --- |
|  | Test Duration | Result |
| Abrasion resistance (Bayer) | 300 cycles | Abrasion ratio = 16 |
| Scratch resistance (Steel ball test) | Rating 2 @ 2 N | Pass |
| Salt spray | 288 hrs | Fail |
| Thermal Shock | 200 cycles | Pass |
| Dry heat Test | 115° C. | Fail |

TABLE 25

| Optical Measurement Data (Desired Optical Effect) | |
| --- | --- |
| Photopic reflection | Y = 49.5% |
| Photopic transmission | Y = 0.1% |
| Reflected colour target on transparent substrate - CIE L*a*b* scale measured with illuminant A/2 | L* = 76<br>a* = −9.2<br>b* = −11.6 |
| Transmitted colour target on transparent substrate - CIE L*a*b* scale measured with illuminant A/2 | L* = 1.0<br>a* = 0.5<br>b* = −0.7 |

Example 10—Bright Chrome (Substrate with Complex Geometry—Planetary Pylon)

This technique is used to improve the consistency and reproducibility of coatings on substrates with complex geometry. Typically, a substrate will be classified as having a complex geometry if it contains multiple surfaces to be coated and wherein the face of at least two of the surfaces are inflected at angle of greater than 45 degrees relative to each other. For example, the faces of at least two surfaces to be coated may be inflected at an angle of at least 45 degreed past a straight angle to form a face-to-face reflex angle equal to or greater than 225 degrees. Alternatively, the faces of at least two surfaces to be coated may be inflected at least 45 degrees toward each other to form an obtuse or acute face-to-face angle of 135 degrees or less.

The process of coating a substrate with a complex geometry is similar to that described in example 1, with the following alterations.

To get a more uniform deposition onto substrate having a complex geometry, the substrate is loaded into a batch type vacuum sputter coater. The substrate is then rotated about 2 axes in the sputter coater during deposition of the coating. The two axis are parallel with primary axis is at the centre of the chamber and the secondary axis is located between the primary axis and the circumference of the coating drum, generally closer to the circumference than the central axis. The substrate is mounted such that it rotates on the secondary axis and simultaneously the secondary axis rotates around the primary axis. In this manner the rotation of the substrate is much like the rotation of a planet around the sun, hence this technique is also called "planetary motion".

By positioning portions of the substrate at differing angles relative to the target throughout the rotation of the substrate, this co-rotation ensures the substrate having a complex geometry does not self-shadow.

The deposition parameters are set out below:

Stress Controlling System

|  | Stress Controlling Layer 1 |
| --- | --- |
| Dual rotatable Silicon Target 99.90% | Power 33 kW @ 27 kHz |
| Total Gas flow | Argon 180 sccm |
|  | Oxygen 336 sccm |
| RPM | 9 |
| Number of rounds | 72 |
| Base Pressure (mbar) | 5e−5 |
| Run Pressure (mbar) | 2e−3 |
| Thickness (nm) | 250 |

Spectrally Controlling System

|  | Spectrally Controlling System Layer 1 | Spectrally Controlling System Layer 2 |
| --- | --- | --- |
| Material | CrZr | SiO2 |
| Chrome Zirconium Target 98.5%/1.5% | Power 55 kW | — |
| Silicon Target 99.9% | — | Power 21 kW |
| Total Gas flow | Argon 160 to 145 sccm (45 sec ramp) Nitrogen 90 to 20 sccm (45 sec ramp) | Argon 96 sccm Oxygen 202 sccm |
| RPM | 10.8 | 10.5 |
| Number of rounds | 6 | 4 |
| Base Pressure (mbar) | 5e−5 | 5e−5 |
| Run Pressure (mbar) | 2e−3 | 2e−3 |
| Thickness (nm) | 28 | 15 |

Protective Layer

|  | Protective Layer 1 |
| --- | --- |
| Material | HMDSO 210 sccm |
| RPM | 20 |
| Number of rounds | 4 |
| Thickness (nm) | 8 |

The measured residual stress of layers was determined and the durability performance was tested. The results are set out in Tables 26, 27 and 28, respectively.

TABLE 26

| Measured stress of the layers | |
| --- | --- |
| Layer | Stress |
| Stress controlling layer | −144 MPa |
| Total residual stress | −76 MPa |

TABLE 27

| Durability Performance | | |
| --- | --- | --- |
|  | Test Duration | Result |
| Abrasion resistance (Bayer) | 300 cycles | Abrasion ratio = 13 |
| Scratch resistance (Steel ball test) | Rating 2 @ 2N | Pass |
| Salt spray | 288 hrs | Pass |
| Thermal Shock | 200 cycles | Pass |
| Dry heat Test | 115° C. | Pass |

TABLE 28

| Optical Measurement Data | |
| --- | --- |
| Photopic reflection | Y = 50.9% |
| Photopic transmission | Y = 8.8% |
| Reflected colour target on transparent substrate - CIE L*a*b* scale measured with illuminant A/2 | L* = 76.6 a* = −0.5 b* = 0.6 |
| Transmitted colour target on transparent substrate - CIE L*a*b* scale measured with illuminant A/2 | L* = 35.6 a* = 2.1 b* = 2.5 |

Example 11—Bright Chrome (Zero Optical Transmission—for Illuminated Patterns)

Figure 3:
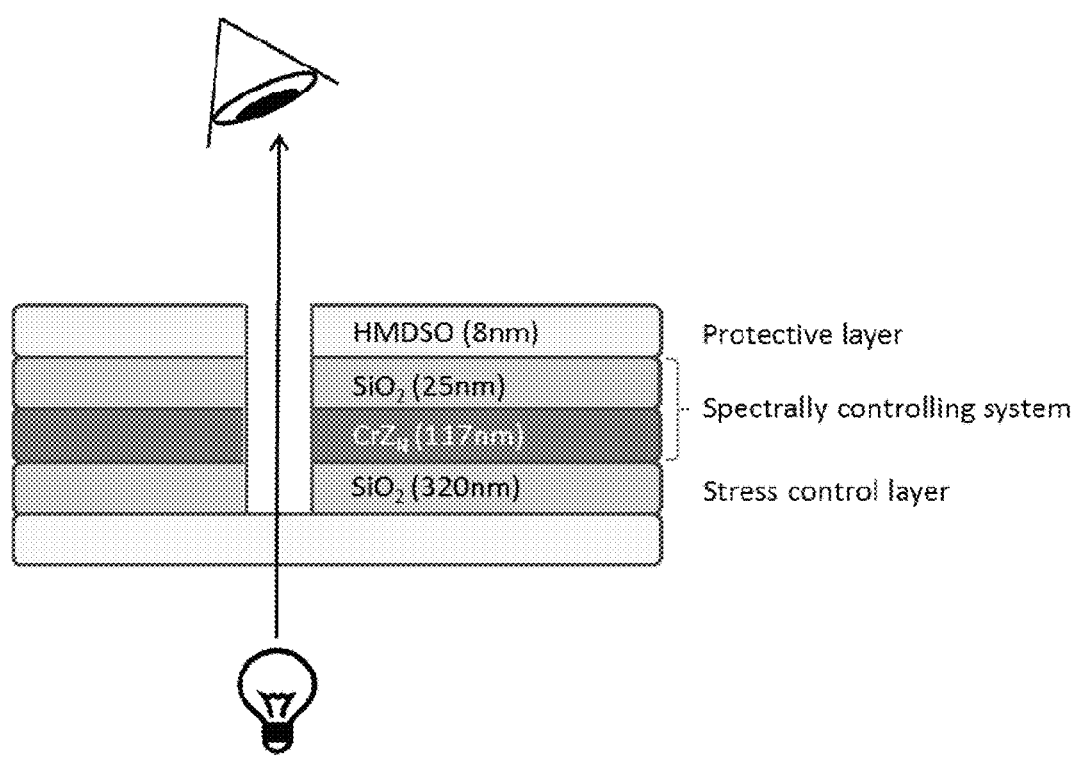

This technique is used to provide a coating which has zero optical transmission through the coating. Portions of the coating can then be ablated through the full depth of the coating, via techniques such as laser etching, thereby forming patterns which can be illuminated by rear lighting. The zero photopic transmission of the coating prevents light bleed-through of the rear illumination source. A schematic representation of a coated substrate in accordance with this embodiment is illustrated in FIG. 3.

One particular form which this embodiment of the invention may take is the form of a decorative badge for an automobile. Such an embodiment comprises a plastic substrate formed in the desired shape of the badge with a zero optical transmission decorative coating in accordance with the present invention. Portions of the decorative coating are then laser etched or removed to introduce lettering and graphics into the coating which can be emphasized by underlying coloured material. Furthermore, individual highlights can be introduced into the coating in the form of portions of the coating that are completely removed from the substrate via laser ablation, or other acceptable means, to permit controlled light transmission through the coating. The badge can then be backlit to emphasize the highlights and to create a desired visual appeal.

Similar laser etching has been attempted on electroplated plastic substrates. Problematically, the power of the laser needed to remove the relatively thick electroplated layers of copper, nickel and chrome burn and damage the plastic substrate. Advantageously, the coating system of the present invention enables such a decorative article.

A process as described in Example 11 is employed. With the following alterations.

Stress Controlling System

| | Stress Controlling Layer 1 |
|---|---|
| Dual rotatable Silicon Target 99.90% | Power 30 kW @ 27 kHz |
| Total Gas flow | Argon 160 sccm |
| | Oxygen 261 sccm |
| RPM | 8.4 |
| Number of rounds | 65 |
| Base Pressure (mbar) | 3e−5 |
| Run Pressure (mbar) | 2e−3 |
| Thickness (nm) | 320 |

Spectrally Controlling System

| | Spectrally Controlling System Layer 1 | Spectrally Controlling System Layer 2 |
|---|---|---|
| Material | CrZr | SiO$_2$ |
| Chrome Zirconium Target 98.5%/1.5% | Power 60 kW | — |
| Silicon Target 99.90% | — | Power 21 kW |
| Total Gas flow | Argon 132 to 240 sccm (75 sec ramp) Nitrogen 108 to 0 sccm (75 sec ramp) | Argon 96 sccm Oxygen 202 sccm |
| RPM | 6 | 24 |
| Number of rounds | 9 | 8 |
| Base Pressure (mbar) | 3e−5 | 3e−5 |
| Run Pressure (mbar) | 2e−3 | 2e−3 |
| Thickness (nm) | 117 | 25 |

Protective Layer

| | Protective Layer 1 |
|---|---|
| Material | HMDSO 210 sccm |
| RPM | 20 |
| Number of rounds | 8 |
| Thickness (nm) | 8 nm |

The measured residual stress of layers was determined and the durability performance was tested. The results are set out in Tables 29, 30, and 31, respectively.

TABLE 29

Measured stress of the layers

| Layer | Stress |
|---|---|
| Stress controlling layer | −143 MPa |
| Total residual stress | −63.9 MPa |

TABLE 30

Durability Performance

| | Test Duration | Result |
|---|---|---|
| Abrasion resistance (Bayer) | 300 cycles | Abrasion ratio = 15 |
| Scratch resistance (Steel ball test) | Rating 2 @ 2 N | Pass |
| Salt spray | 288 hrs | Pass |
| Thermal Shock | 200 cycles | Pass |
| Dry heat Test | 115° C. | Pass |

TABLE 31

Optical Measurement Data

| Photopic reflection | Y = 57.38% |
|---|---|
| Photopic transmission | Y = 0.0% |
| Reflected colour target on transparent substrate - CIE L*a*b* scale measured with illuminant A/2 | L* = 80.39 a* = −0.56 b* = −0.33 |

Example 12—Bright Chrome (Zero Optical Transmission—Low Residual Stress—Compressive)

A process as described in example 11 is employed. With the following alterations:

Stress Controlling System

| | Stress Controlling Layer 1 |
|---|---|
| Dual rotatable Silicon Target 99.90% | Power 30 kW @ 27 kHz |
| Total Gas flow | Argon 160 sccm |
| | Oxygen 261 sccm |
| RPM | 8.4 |
| Number of rounds | 25 |
| Base Pressure (mbar) | 3e−5 |
| Run Pressure (mbar) | 2e−3 |
| Thickness | 130 nm |

The measured residual stress of layers was determined and the durability performance was tested. The results are set out in Tables 32, 33, and 34, respectively.

TABLE 32

Measured stress of the layers

| Layer | Stress |
|---|---|
| Stress controlling layer | −108 MPa |
| Total residual stress | −6 MPa |

TABLE 33

Durability Performance

| | Test Duration | Result |
|---|---|---|
| Dry heat Test | 115° C. | Pass |

TABLE 34

Optical Measurement Data

| | |
|---|---|
| Photopic reflection | Y = 58.79% |
| Photopic transmission | Y = 0.0% |
| Reflected colour target on transparent substrate - CIE L*a*b* scale measured with illuminant A/2 | L* = 81.18<br>a* = −0.87<br>b* = −0.7 |

Example 13—Bright Chrome (Zero Optical Transmission—Low Residual Stress—Tensile)

A process as described in example 11 is employed. With the following alterations:

Stress Controlling System

| | Stress Controlling Layer 1 |
|---|---|
| Dual rotatable Silicon Target 99.90% | Power 30 kW @ 27 kHz |
| Total Gas flow | Argon 160 sccm<br>Oxygen 261 sccm |
| RPM | 8.4 |
| Number of rounds | 3 |
| Base Pressure (mbar) | 3e−5 |
| Run Pressure (mbar) | 2e−3 |
| Thickness | 30 nm |

The measured residual stress of layers was determined and the durability performance was tested. The results are set out in Tables 35, 36, and 37, respectively.

TABLE 35

Measured stress of the layers

| Layer | Stress |
|---|---|
| Stress controlling layer | −38 MPa |
| Total residual stress | 5 MPa |

TABLE 36

Durability Performance

| | Test Duration | Result |
|---|---|---|
| Dry heat Test | 115° C. | Fail (crazed) |

TABLE 37

Optical Measurement Data

| | |
|---|---|
| Photopic reflection | Y = 57.33% |
| Photopic transmission | Y = 0.0% |
| Reflected colour target on transparent | L* = 80.37 |

TABLE 37-continued

Optical Measurement Data

| | |
|---|---|
| substrate - CIE L*a*b* scale measured with illuminant A/2 | a* = −0.50<br>b* = −0.27 |

Example 14—Measure of Durability Under High Temperature Conditions

For acceptability, decorative coatings need to have sufficient durability under conditions of operation and in many instances must meet regulated or industry/manufacturer guidelines. For automotive purposes a coating needs to show no crazing at temperatures of up to 115° C.

In order to assess the durability of decorative coatings for automotive purposes a series of samples, having coatings with the same optical properties, were created with varying residual stress profiles. The samples were subjected to variable dry temperatures for a period of one hour to uncover any stress-related issues.

The results of the testing are given below in Table 38. As can be seen samples having a decorative coating wherein the overall residual stress of the decorative coating was compressive demonstrated no crazing at temperatures up to 115° C., while samples with decorative coatings wherein the overall residual stress was tensile demonstrated crazing while hot at temperatures as low as 110° C.

| Film stress | Film thickness | Dry Heat Test | | | | |
|---|---|---|---|---|---|---|
| (MPa) | (nm) | 100° C. | 110° C. | 115° C. | 120° C. | 125° C. |
| −67 | 400 | ok | ok | ok | ok | crazed |
| −41 | 350 | ok | ok | ok | ok | crazed |
| −6 | 280 | ok | ok | ok | crazed | crazed |
| 5 | 175 | ok | crazed when hot | crazed | crazed | crazed |
| 16 | 210 | ok | crazed when hot | crazed | crazed | crazed |

A person skilled in the art will understand that there may be variations and modifications other than those specifically described. It is to be understood that the invention includes all such variations and modifications. The invention also includes all steps, features, compositions and compounds referred to, or indicated in this specification, individually or collectively, and any and all combinations of any two or more of the steps or features.

The principle and mode of operation of this invention have been explained and illustrated in its preferred embodiment. However, it must be understood that this invention may be practiced otherwise than as specifically explained and illustrated without departing from its spirit or scope.

The claims defining the invention are as follows:

1. A plastic substrate coated with a decorative coating, the decorative coating including a spectrally controlling system and a stress controlling system, the spectrally controlling system being multiple layers and optionally including a protective layer, and the stress controlling system being at least a single layer between the spectrally controlling system and the substrate, wherein the multiple layers of the spectrally controlling system are absorbing layers alternating with transparent layers, the optical thickness of the spectrally controlling system being selected such that the decorative coating achieves a desired optical effect, and wherein at least one layer of the stress controlling system has a compressive stress of an amount such that the overall residual stress of the decorative coating is compressive when measured in the absence of the optional protective layer, wherein the material for the stress controlling system is selected from the group of materials comprising $SiO_x$, $SiO_xN_y$, $CrN_x$, $NbO_x$, $TaO_x$, $ZrO_x$, where x and y are both between 0.1 and 2.0; and wherein a hardcoating is included between the decorative coating and the substrate.

2. A coated plastic substrate according to claim 1, wherein the absorbing layer is a layer comprising a material, or a blend of materials, having a measured optical extinction coefficient greater than 1 in the spectral range of 400 to 1000 nm.

3. A coated plastic substrate according to claim 2, wherein the absorbing layer material is a metal, a metalloid, a metal alloy or a mixture thereof that has a refractive index such that the sum of the refractive index and the extinction coefficient is greater than 2 and the extinction coefficient itself is greater than 1.

4. A coated plastic substrate according to claim 3, wherein the metal, metalloid or metal alloy for the absorbing layers are selected from the group including: chromium, aluminium, titanium, nickel, molybdenum, zirconium, tungsten, silicon, niobium, tantalum, vanadium, cobalt, manganese, silver, zinc, indium, germanium, tin and mixtures thereof; and an oxide, nitride, boride, fluoride or carbide thereof, and mixtures thereof.

5. A coated plastic substrate according to claim 1, wherein the transparent layer is a layer comprising a material, or a blend of materials, having a measured optical extinction coefficient of less than 1 in the spectral range of 400 to 1000 nm.

6. A coated plastic substrate according to claim 5, wherein the transparent layer material is a metal, a metalloid, a metal alloy or a mixture thereof that has a refractive index such that the sum of the refractive index and the extinction coefficient is less than 3 and the extinction coefficient itself is less than 1.

7. A coated plastic substrate according to claim 6, wherein the metal, metalloid or metal alloy for the transparent layers are selected from the group of metals, metalloids and metal alloys including: boron, silicon, germanium, antimony, tellurium, polonium, niobium, zirconium, magnesium, tin, tantalum, aluminium, chromium, titanium and mixtures thereof; and an oxide, nitride, boride, fluoride or carbide thereof; and mixtures thereof.

8. A coated plastic substrate according to claim 7, wherein the spectrally controlling system is an interference system made up of alternating layers of materials of different refractive indices.

9. A coated plastic substrate according to claim 1, wherein the spectrally controlling system includes a protective layer that is an outermost layer of the spectrally controlling system.

10. A coated plastic substrate according to claim 9, wherein the protective layer is a plasma polymerised hexamethyldisiloxane (HMDSO), a fluoro polymer based coating deposited via evaporation or liquid transfer techniques, or a liquid hard-coating.

11. A coated plastic substrate according to claim 1, wherein at least one layer of the stress controlling system has a compressive stress of an amount such that the overall residual stress of the decorative coating is less than −6 MPa when measured in the absence of the optional protective layer.

12. A coated plastic substrate according to claim 1, wherein at least one layer of the stress controlling system has a compressive stress of an amount such that the overall residual stress of the decorative coating is less than −63 MPa when measured in the absence of the optional protective layer.

13. A coated plastic substrate according to claim 1, wherein at least one layer of the stress controlling system has a compressive stress of an amount such that the overall residual stress of the decorative coating is less than −76 MPa when measured in the absence of the optional protective layer.

14. A coated plastic substrate according to claim 1, wherein at least one layer of the stress controlling system has a compressive stress of an amount such that the overall residual stress of the decorative coating is less than −112 MPa when measured in the absence of the optional protective layer.

15. A coated plastic substrate according to claim 1, wherein at least one layer of the stress controlling system has a compressive stress of an amount such that the overall residual stress of the decorative coating is greater than −360 MPa when measured in the absence of the optional protective layer.

16. A coated plastic substrate according to claim 1, wherein at least one layer of the stress controlling system has a compressive stress of an amount such that the overall residual stress of the decorative coating is greater than −300 MPa when measured in the absence of the optional protective layer.

17. A coated plastic substrate according to claim 1, wherein at least one layer of the stress controlling system has a compressive stress of an amount such that the overall residual stress of the decorative coating is greater than −250 MPa when measured in the absence of the optional protective layer.

18. A coated plastic substrate according to claim 1, wherein the stress controlling system is a single layer of a material which, when deposited, produces a high level of compressive stress.

19. A coated plastic substrate according to claim 1, wherein the stress controlling system is a multilayer system including a compressive or slightly tensile layer deposited on the substrate and a highly compressive layer deposited thereon which, when deposited, produces a high level of compressive stress.

20. A method for applying a decorative coating to a plastic substrate, the decorative coating providing the coated substrate with a desired optical effect, the decorative coating including a spectrally controlling system and a stress controlling system, the spectrally controlling system being multiple layers and optionally including a protective layer, and the stress controlling system being at least a single layer, wherein the multiple layers of the spectrally controlling system are absorbing layers alternating with transparent layers, the method including:

determining the desired optical effect;

determining a suitable spectrally controlling system that will provide the desired optical effect, with reference to a required optical thickness for the spectrally controlling system;

determining a suitable stress controlling system that has a compressive stress of an amount such that the overall residual stress of the decorative coating is compressive when measured in the absence of the optional protective layer; coating the suitable stress controlling system upon the plastic substrate; coating the suitable spectrally controlling system upon the stress controlling system; and thereby forming a coated plastic substrate with the desired colour;

wherein the material for the stress controlling system is selected from the group of materials comprising $SiO_x$, $SiO_xN_y$, $CrN_x$, $NbO_x$, $TaO_x$, $ZrO_x$, where x and y are both between 0.1 and 2.0; and wherein a hardcoating is included between the decorative coating and the substrate.

* * * * *